(12) United States Patent
Tavakoli et al.

(10) Patent No.: US 12,529,147 B2
(45) Date of Patent: Jan. 20, 2026

(54) LOW-K AND TANTALUM NITRIDE BARRIER RECOVERY USING A SOAK PROCESS

(71) Applicant: Applied Materials, Inc., Santa Clara, CA (US)

(72) Inventors: Mohammad Mahdi Tavakoli, Santa Clara, CA (US); Avgerinos V. Gelatos, Scotts Valley, CA (US); Joung Joo Lee, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 24 days.

(21) Appl. No.: 18/400,869

(22) Filed: Dec. 29, 2023

(65) Prior Publication Data

US 2024/0327991 A1    Oct. 3, 2024

Related U.S. Application Data

(60) Provisional application No. 63/455,963, filed on Mar. 30, 2023.

(51) Int. Cl.
*C23C 28/00* (2006.01)
(52) U.S. Cl.
CPC .............. *C23C 28/32* (2013.01); *C23C 28/34* (2013.01)
(58) Field of Classification Search
None
See application file for complete search history.

(56) References Cited

U.S. PATENT DOCUMENTS

| 10,913,893 | B2 * | 2/2021 | Xu ................. H01L 21/31111 |
| 2019/0214296 | A1 | 7/2019 | Wang et al. |
| 2021/0123136 | A1 | 4/2021 | Kalutarage et al. |
| 2021/0384035 | A1 | 12/2021 | Fisher et al. |
| 2021/0407853 | A1 * | 12/2021 | Li ................. H01L 23/53238 |
| 2022/0181201 | A1 | 6/2022 | Xu et al. |
| 2022/0267904 | A1 | 8/2022 | Bajaj et al. |
| 2023/0295803 | A1 | 9/2023 | Yan et al. |

FOREIGN PATENT DOCUMENTS

WO    2022025894 A1    2/2022

OTHER PUBLICATIONS

International Search Report/ Written Opinion issued to PCT/US2024/014130 on Jun. 11, 2024.

* cited by examiner

*Primary Examiner* — Shamim Ahmed
*Assistant Examiner* — Bradford M Gates
(74) *Attorney, Agent, or Firm* — Patterson + Sheridan, LLP

(57) ABSTRACT

Embodiments herein describe a method of manufacturing an interconnect structure. The method includes depositing a selective tungsten layer on a tungsten containing surface, the tungsten containing surface is disposed within a feature, wherein the feature includes one or more surfaces that comprise a dielectric material, and the depositing of the selective tungsten layer results in a residue forming on the dielectric material. The method also includes performing a reducing reaction via exposing the residue and dielectric material to an organosilane containing precursor soak, wherein the organosilane containing precursor reduces the residue. The method further includes forming a conformal layer over the dielectric material and the selective tungsten layer.

18 Claims, 7 Drawing Sheets

LOW-K AND TANTALUM NITRIDE BARRIER RECOVERY USING A SOAK PROCESS

CROSS-REFERENCE TO RELATED APPLICATIONS

This application claims the benefit of U.S. Provisional Patent Ser. No. 63/455,963, filed Mar. 30, 2023, which is hereby incorporated by reference in its entirety.

BACKGROUND

Field

Embodiments described herein generally relate to methods for filling gaps in features formed in a substrate. In particular, embodiments of the disclosure relate to methods for post-treatment of features containing low-k dielectrics formed on a substrate.

Description of the Related Art

Tungsten (W) is widely used in integrated circuit (IC) device manufacturing to form conductive features in a semiconductor device where relatively low electrical resistance and relativity high resistance to electromigration are desired. For example, tungsten may be used as a metal fill material to form source contacts, drain contacts, metal gate fill, gate contacts, interconnects (e.g., horizontal features formed in a surface of a dielectric material layer), and vias (e.g., vertical features formed through a dielectric material layer to connect other interconnect features disposed there above and there below). Due to its relativity low resistivity, tungsten is also commonly used to form interconnects at the MO level of IC devices, and also bit lines and word lines used to address individual memory cells in a memory cell array of a three-dimensional NAND (3D NAND) device.

Conventionally, post-processing treatment methods used to remove tungsten and chlorine contamination from low-k dielectric surfaces during a device fabrication process have been found to damage the low-k dielectric layer. The presence of the contamination within a feature or the damage created to the low-k material within the feature during the contamination removal process can affect the electrical characteristics of a semiconductor device that includes the feature and/or reduce the lifetime of the formed semiconductor device.

Therefore, there is a need for a process that solves these problems.

SUMMARY

Embodiments described herein generally relate to methods for filling gaps in semiconductors. In particular, embodiments of the disclosure relate to methods for post-treatment of low-k dielectrics.

In one embodiment, a method of manufacturing an interconnect structure is disclosed. The method includes depositing a selective tungsten layer on a tungsten containing surface, the tungsten containing surface is disposed within a feature, wherein the feature includes one or more surfaces that comprise a dielectric material, and the depositing of the selective tungsten layer results in a residue forming on the dielectric material. The method also includes performing a reducing reaction via exposing the residue and dielectric material to an organosilane containing precursor soak, wherein the organosilane containing precursor reduces the residue. The method further includes forming a conformal layer over the dielectric material and the selective tungsten layer.

In another embodiment, a method of manufacturing an interconnect structure is disclosed. The method includes performing a pretreatment process. The method also includes depositing a selective tungsten layer on a tungsten containing surface, the tungsten containing surface is disposed within a feature, wherein the feature includes one or more surfaces that comprise a low-k dielectric material, wherein the depositing results in residue formation on the low-k dielectric material. The method further includes performing a reducing reaction via a 1-methyl-3,6-bis(trimethylsilyl)-1,4-cyclohexane (CHD) soak, wherein the CHD reduces the residue. The method also includes forming a conformal layer over the low-k dielectrics and the selective tungsten layer and depositing a metal fill layer over the conformal layer.

In yet another embodiment, method of manufacturing an interconnect structure is disclosed. The method includes performing a pretreatment process. The method also includes depositing a selective tungsten layer on a tungsten containing surface using a fluorine-free tungsten (FFW) deposition process, wherein the tungsten containing surface is disposed within a feature, wherein the feature includes one or more surfaces that comprise a low-k dielectric material, wherein the depositing results in a chlorine and tungsten residue formation on the low-k dielectric material; The method further includes performing a reducing reaction via a 1-methyl-3,6-bis(trimethylsilyl)-1,4-cyclohexane (CHD) soak, wherein the CHD reduces the chlorine and tungsten residue, forming a conformal layer over the low-k dielectric material and the selective tungsten layer, and depositing a metal fill layer over the conformal layer.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments described herein generally relate to methods for filling gaps in features formed in a substrate. In particular, embodiments of the disclosure relate to methods for post-treatment of features containing low-k dielectrics formed on a substrate.

Selective growth of tungsten (W) on a tungsten via within an interconnect structure may result in residue accumulation on low-k dielectric structures within the interconnect structure. The residue may result in tungsten selectivity loss during subsequent tungsten deposition processes and/or lowered tantalum nitride (TaN) barrier quality. Therefore, there is a need for a method that is able to remove a residue from a surface of a feature formed within a substrate prior to filling a feature with one or more metal layers. In some embodiments, the method includes removing a residue formed after performing a selective tungsten growth on a feature that contains a low-k dielectric material.

The methods disclosed herein include a post-treatment, an organosilane containing precursor soak (e.g., 1-methyl-3,6-bis(trimethylsilyl)-1,4-cyclohexane (CHD) soak), that significantly reduces the level of residues, which can include halogen containing residues (e.g., chlorine (Cl) residues), and prevent damage to the conformal layer barrier better than the other conventional processes. Conventional post-treatment methods, such as sputtering based pre-clean processes, advanced pre-clean processes (APC), capacitively coupled plasmas (CCP) hydrogen ($H_2$) based plasma, and $H_2O$ based pre-clean processes, are not as effective as the organosilane soak process described herein for residue removal and cannot fully prevent the degradation of the conformal layer's barrier resistance due to the presence of the residue on an underlying surface. More importantly, most conventional post-treatments methods damage the low-k material, which has been found not to be the case for the CHD soak process disclosed herein. Additionally, the CHD soak requires less time than other post-treatment methods and can be integrated into the same chamber as the fluorine-free tungsten deposition process.

Figure 1:
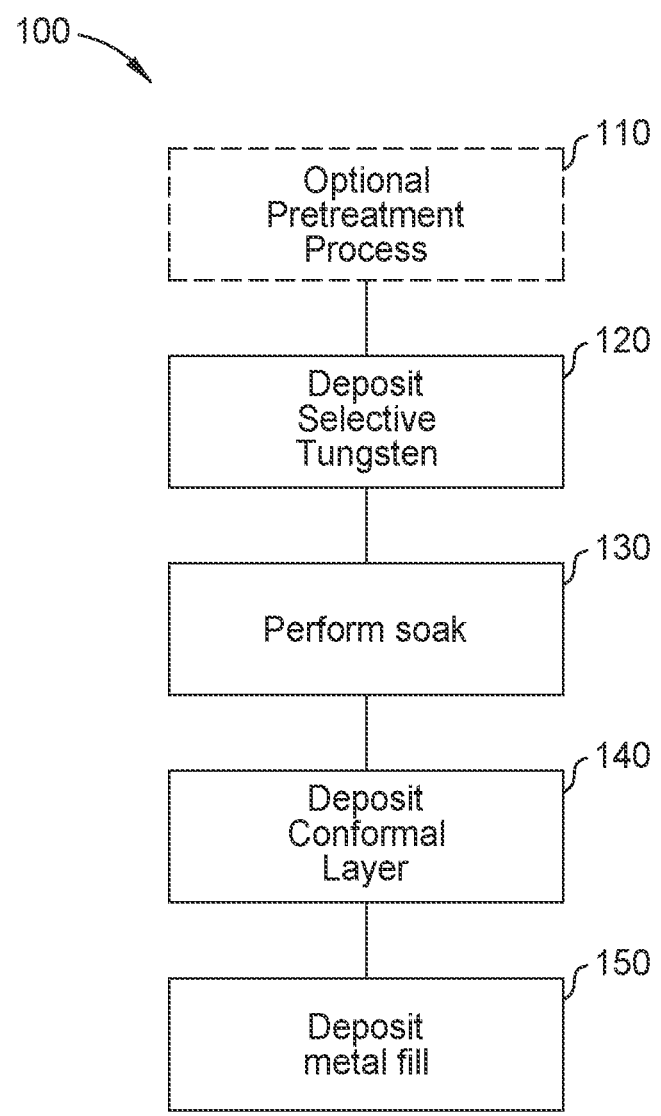
FIG. 1 illustrates an exemplary process method according to one or more embodiments of the disclosure.

FIG. 1 illustrates an exemplary process method 100 according to one or more embodiments of the disclosure. FIGS. 2A-2E illustrate cross-sectional schematic views of a interconnect structure 200 during a process method 100 in accordance with one or more embodiments of the disclosure. It should be understood that FIGS. 2A-2E illustrate only partial schematic views of the interconnect structure 200, and the interconnect structure 200 may contain any number of transistor sections and additional materials having aspects illustrated in the figures. It should also be noted that although the method 100 illustrated in FIG. 1 is described sequentially, other process sequences that include one or more operations that have been omitted and/or added, and/or have been rearranged in another desirable order, fall within the scope of the embodiments of the disclosure provided herein.

The term "substrate" as used herein refers to a layer of material that serves as a basis for subsequent processing operations and includes a surface to be cleaned. The substrate may be a silicon based material or any suitable insulating materials or conductive materials as needed. The substrate may include a material such as crystalline silicon (e.g., Si<100> or Si<111>), silicon oxide, strained silicon, silicon germanium, doped or undoped polysilicon, doped or undoped silicon wafers and patterned or non-patterned wafers, silicon on insulator (SOI), carbon doped silicon oxides, silicon nitride, doped silicon, germanium, gallium arsenide, glass, or sapphire.

Figure 2A:
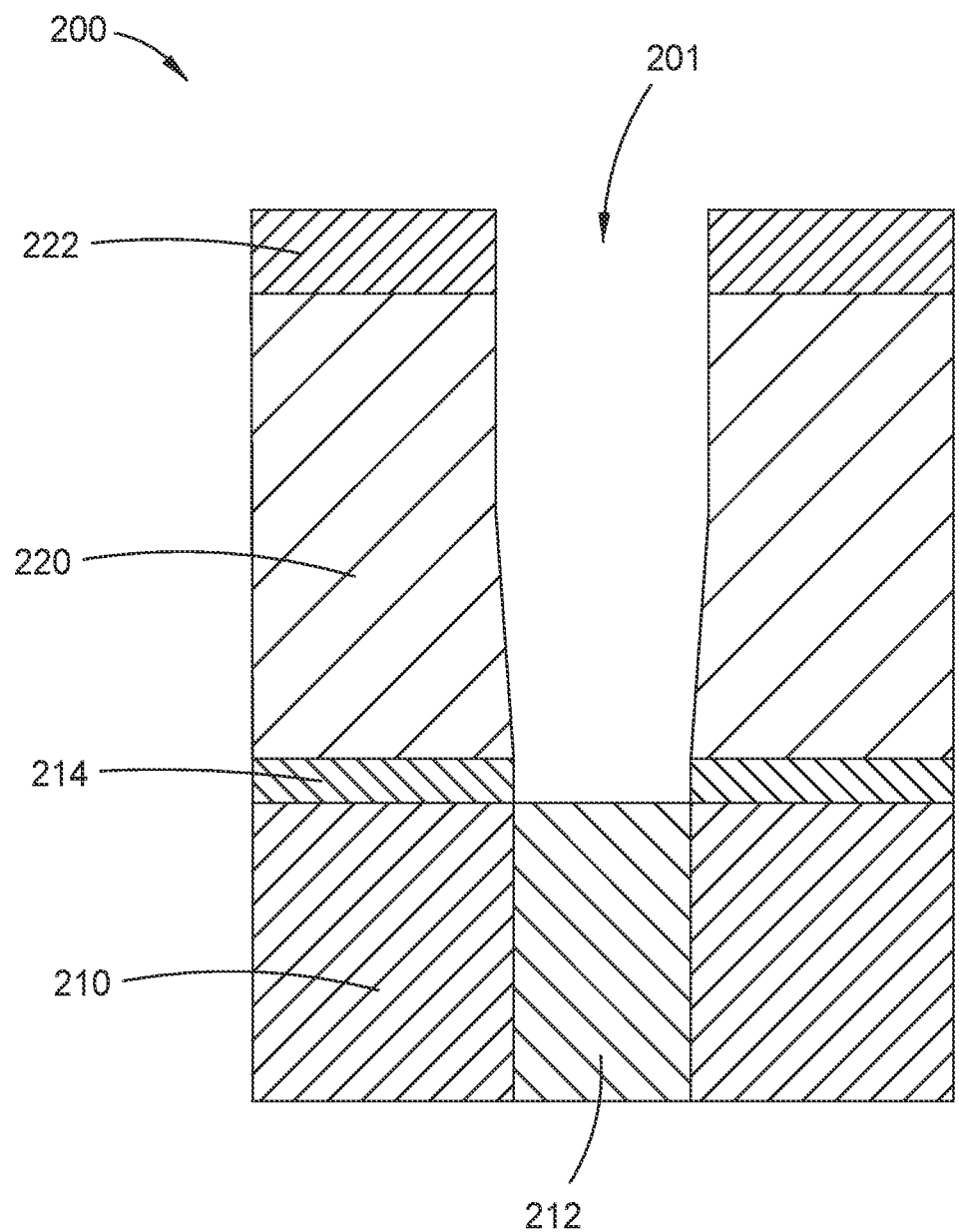
FIGS. 2A-2E illustrate cross-sectional schematic views of a semiconductor device during a process method in accordance with one or more embodiments of the disclosure.

In some embodiments, the method 100 includes an optional pretreatment process at operation 110. FIG. 2A illustrates a interconnect structure 200 after operation 110 has been performed. In FIG. 2A, a hard masks 222 is disposed over the surface of a low-k dielectric layer 220 that is formed on a etch stop layer 214. The hard masks 222, low-k dielectric layer 220 and etch stop layers 214 include the feature 201 formed therein. The low-k dielectrics may be formed of organosilicate glass (SiCOH), silicon dioxide ($SiO_2$), silicon nitride ($Si_3N_4$), silicon carbide (SiC), aluminum oxide ($Al_2O_3$), aluminum nitride (AlN), or any other low-k dielectric material. The low-k dielectric 220 is typically disposed on the etch stop layers 214. In some embodiments, the etch stop layers may include aluminum oxide ($Al_2O_3$). The etch stop layers 214 are disposed on dielectric material portions 210 disposed within an underlying contact or interconnect structure. The dielectric material portions 210 may be formed of a dielectric material, such as a silicon dioxide material. Between the dielectric material portions 210 is a tungsten via 212. The dielectric material portions 210 and tungsten via 212 are formed over a substrate (not shown).

In some embodiments, operation 110 is a three step process including: a cleaning process to remove impurities, a defect curing process, and an oxide reduction process. In some embodiments, operation 110 includes etching, reducing, oxidizing, hydroxylating, annealing, and/or thermally treating the interconnect structure 200.

In some embodiments, a radical-based pre-cleaning technique is used for operation 110. In some embodiments, the pre-cleaning technique utilizes a remote plasma source to provide a radical containing gas that is used to remove at least a portion of the residual contaminants, cure defects in the low-k dielectric 220 and/or chemically alter the remaining residual contaminants found within the feature 201.

In some embodiments, during operation 110, the interconnect structure 200 is maintained at a temperature in the range of 200° C. to 550° C. during exposure to a plasma or radical containing gas. In some embodiments, during exposure to the plasma or radical containing gas, the interconnect structure 200 is maintained at a temperature of 345° C.

In some embodiments, during operation 110, the interconnect structure 200 is exposed to helium plasma, hydrogen plasma, or a combination thereof. In some embodiments, the plasma contains helium (He), and the helium is supplied to the interconnect structure 200 between 250 sccm and 500 sccm. In some embodiments, the plasma contains hydrogen ($H_2$), and the hydrogen is supplied to the interconnect structure 200 at a flow of between 10 and 40 sccm. In some embodiments, the interconnect structure 200 is exposed to a plasma that is formed by providing 380 sccm of helium and 20 sccm of hydrogen while maintaining the processing region formed over the substrate at pressure of 300 m Torr.

In some embodiments, operation 110 is performed for a period between 5 s and 1 min. In some embodiments, the operation 110 is performed for a period of 25 s.

Figure 2B:
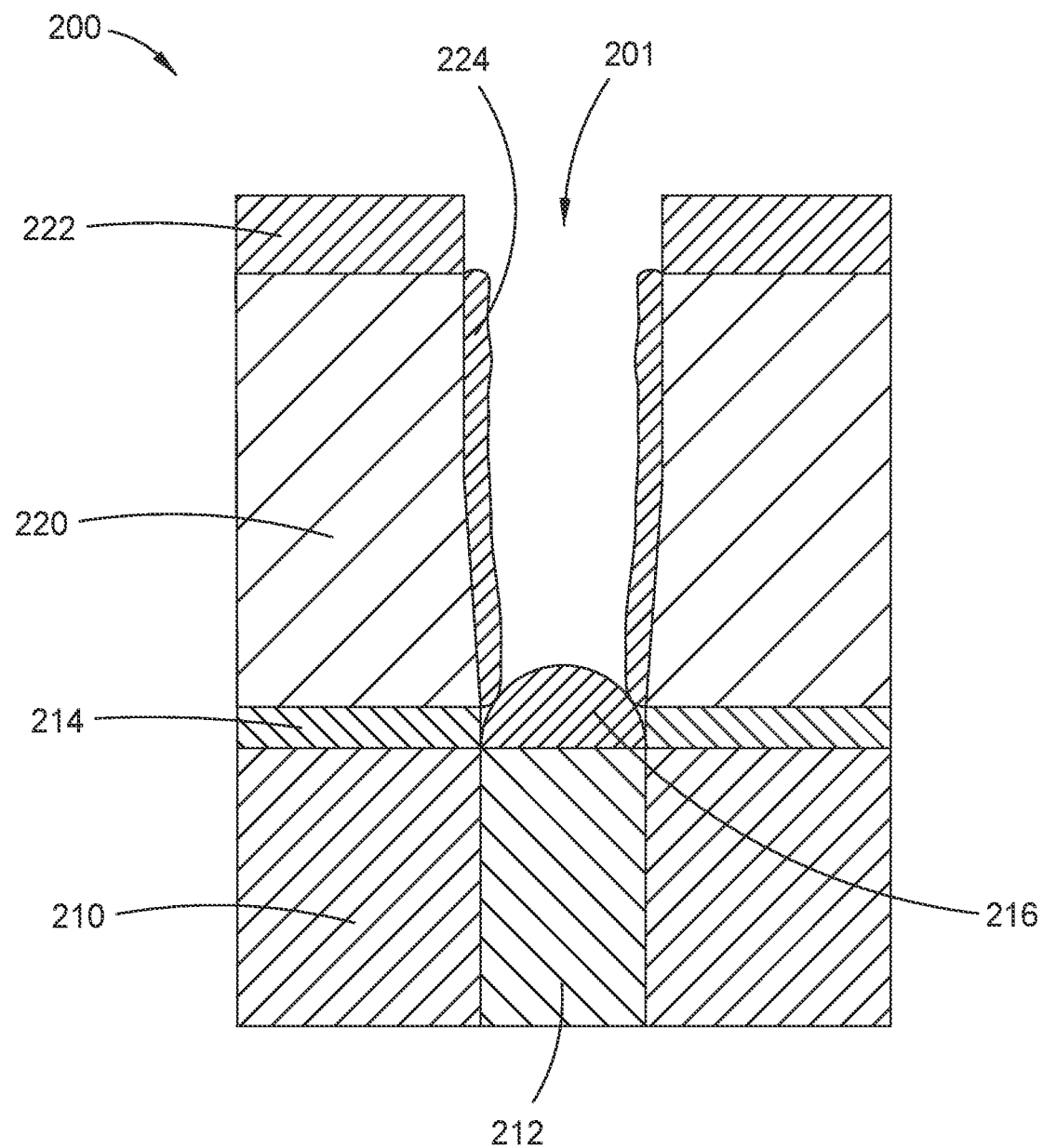

At operation 120, selective tungsten layer 216 is deposited on the tungsten via 212 as shown in FIG. 2B. In some embodiments, the selective tungsten layer 216 is deposited via an atomic layer deposition (ALD) fluorine free tungsten (FFW) deposition process. In operation 120, the selective tungsten layer 216 selectively deposits on the tungsten via 212 over the low-k dielectrics 220.

In some embodiments, operation 120 includes two or more sub-processes. The sub-processes may include exposing the interconnect structure 200 to a fluorine-free tungsten precursor to clean a surface of the interconnect structure 200 and exposing the interconnect structure 200 to a fluorine-free tungsten reagent to deposit a tungsten film.

Some embodiments use fluorine-free tungsten precursors to increase selectivity and/or deposition rate. In some embodiments, the fluorine-free tungsten precursor may be the same chemical as the fluorine-free tungsten reagent. In some embodiments, the fluorine-free tungsten precursor is a different chemical from the fluorine-free tungsten reagent.

In some embodiments, the fluorine-free tungsten precursor and/or the fluorine-free tungsten reagent includes a tungsten halide, a tungsten oxyhalide, a tungsten hydrohalide or combinations thereof. In some embodiments, the fluorine-free tungsten precursor includes greater than or equal to 95%, 98%, 99% or 99.5% on a molar basis of a tungsten halide or a tungsten oxy-halide. In some embodiments, the tungsten halide includes tungsten pentachloride ($WCl_5$), tungsten hexachloride ($WCl_6$), tungsten pentabromide ($WBr_5$), tungsten hexabromide ($WBr_6$) or combinations thereof.

In some embodiments, the tungsten oxyhalide precursor includes tungsten oxytetrachloride ($WOCl_4$), tungsten dichloride dioxide ($WO_2Cl_2$) or combinations thereof. In some embodiments, the fluorine-free tungsten precursor includes tungsten pentachloride ($WCl_5$), tungsten hexachloride ($WCl_6$), tungsten oxytetrachloride ($WOCl_4$), tungsten dichloride dioxide ($WO_2Cl_2$), tungsten pentabromide ($WBr_5$), tungsten hexabromide ($WBr_6$) or combinations thereof. In other embodiments, the first process condition includes a tungsten precursor selected from the group consisting of fluorine free tungsten halide precursors or chlorine-free tungsten halide precursors, such as tungsten pentabromide ($WBr_5$) or tungsten hexabromide ($WBr_6$).

In some embodiments, the fluorine-free tungsten reagent is co-flowed with a reducing agent. In some embodiments, the reducing agent comprises one or more of hydrogen ($H_2$), silane ($SiH_4$), disilane ($Si_2H_6$), trisilane ($Si_3H_8$), tetrasilane ($Si_4H_{10}$), hydrazine ($N_2H_4$) or ammonia ($NH_3$).

In some embodiments, the interconnect structure 200 is exposed to fluorine-free tungsten precursor and/or the fluorine-free tungsten reagent at a temperature between 15° C. and 450° C. In some embodiments, the interconnect structure 200 is exposed to fluorine-free tungsten precursor and the fluorine-free tungsten reagent at a temperature of about 420° C.

In some embodiments, the fluorine-free tungsten precursor is flowed into a chamber at a rate between 500 sccm to 900 sccm. In some embodiments, the fluorine-free tungsten precursor is flowed into a chamber at a temperature ranging between 380° C. and 460° C. In some embodiments, the chamber is maintained at a pressure ranging from 15 Torr to 100 Torr. In some embodiments, the fluorine-free tungsten precursor is $WCl_5$, and the fluorine-free tungsten precursor is flowed at a rate of 700 sccm for about four minutes at a temperature of 420° C. while the chamber is maintained at a pressure of about 28 Torr. In some embodiments, the fluorine-free tungsten reagent is $WCl_5$, which is co-flowed with hydrogen ($H_2$). In some embodiments, the fluorine-free tungsten reagent is flowed for about five minutes at a temperature of 420° C.

As shown in FIG. 2B, a side effect of operation 120 is residue 224 accumulation on the low-k dielectrics 220. The residue 224 may be chlorine, tungsten, byproducts of $WCl_x$ and $WO_xCl_x$, and combinations thereof. The residue 224 may result in tungsten selectivity loss and lowered tantalum nitride (TaN) barrier quality due to the TaN barrier being disposed over the residue 224. In one embodiment, the residue 224 includes trapped Cl radicals and $WCl_x$.

Figure 2C:
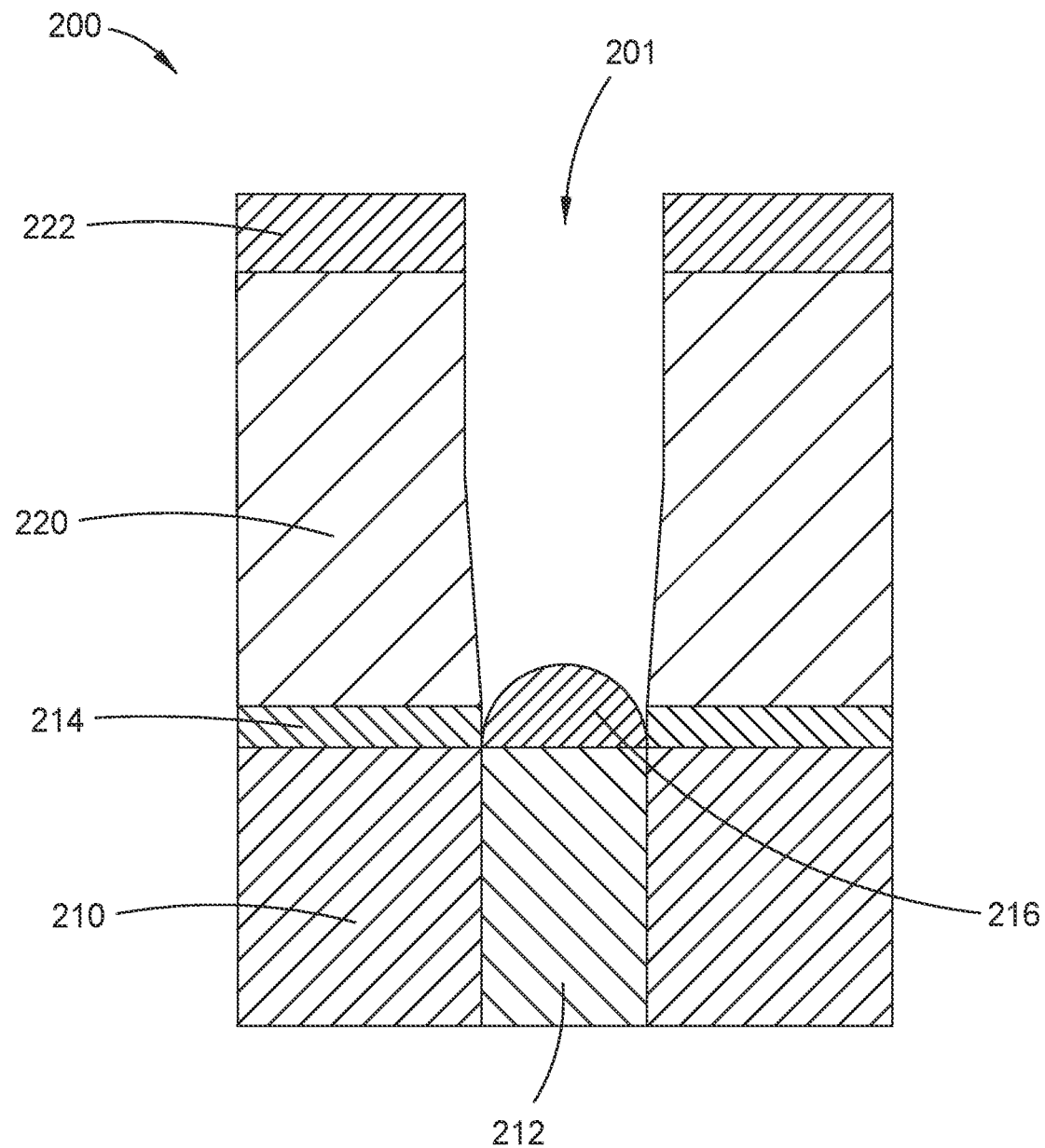

At operation 130, the residue 224 is removed by performing an organosilane containing precursor soak process. In one example, the soak process includes exposing the feature 201 to a precursor gas containing 1-methyl-3,6-bis(trimethylsilyl)-1,4-cyclohexane ($C_{13}H_{26}Si_2$) (CHD). The CHD molecule performs a reduction reaction to remove the residue 224 from the low-k dielectrics 220, as shown in FIG. 2C. In one embodiment, the CHD molecule reacts with the $MCl_x$ and the Cl radicals in the residue 224, wherein M is the metal contamination (e.g., W, Mo, etc.) found on the low-k dielectric material. The byproduct of this reduction reaction is low-k dielectric material chloride ($MCl_5$), trimethylsilyl chloride (($CH_3)_3SiCl$), metal on the low-k dielectric material (M), and toluene ($C_6H_5CH_3$).

In some embodiments, the organosilane containing precursor is combined with a carrier gas. In some embodiments, the flow rate of the organosilane containing precursor and carrier gas is between 50 sccm and 300 sccm. In some embodiments, the flow rate of the organosilane containing precursor and carrier gas is a total of 150 sccm.

In some embodiments, the organosilane containing precursor soak is performed at a temperature between 300° C. and 500° C. In some embodiments, the organosilane containing precursor soak is performed at 400° C.

In some embodiments, the organosilane containing precursor soak is performed at a pressure between 1 Torr and 100 Torr. In some embodiments, the pressure is 5 Torr.

In some embodiments, the organosilane containing precursor soak is performed for a period between 20 seconds and 240 seconds. In some embodiments, the organosilane containing precursor soak is performed for a period of 30 seconds.

Figure 2D:
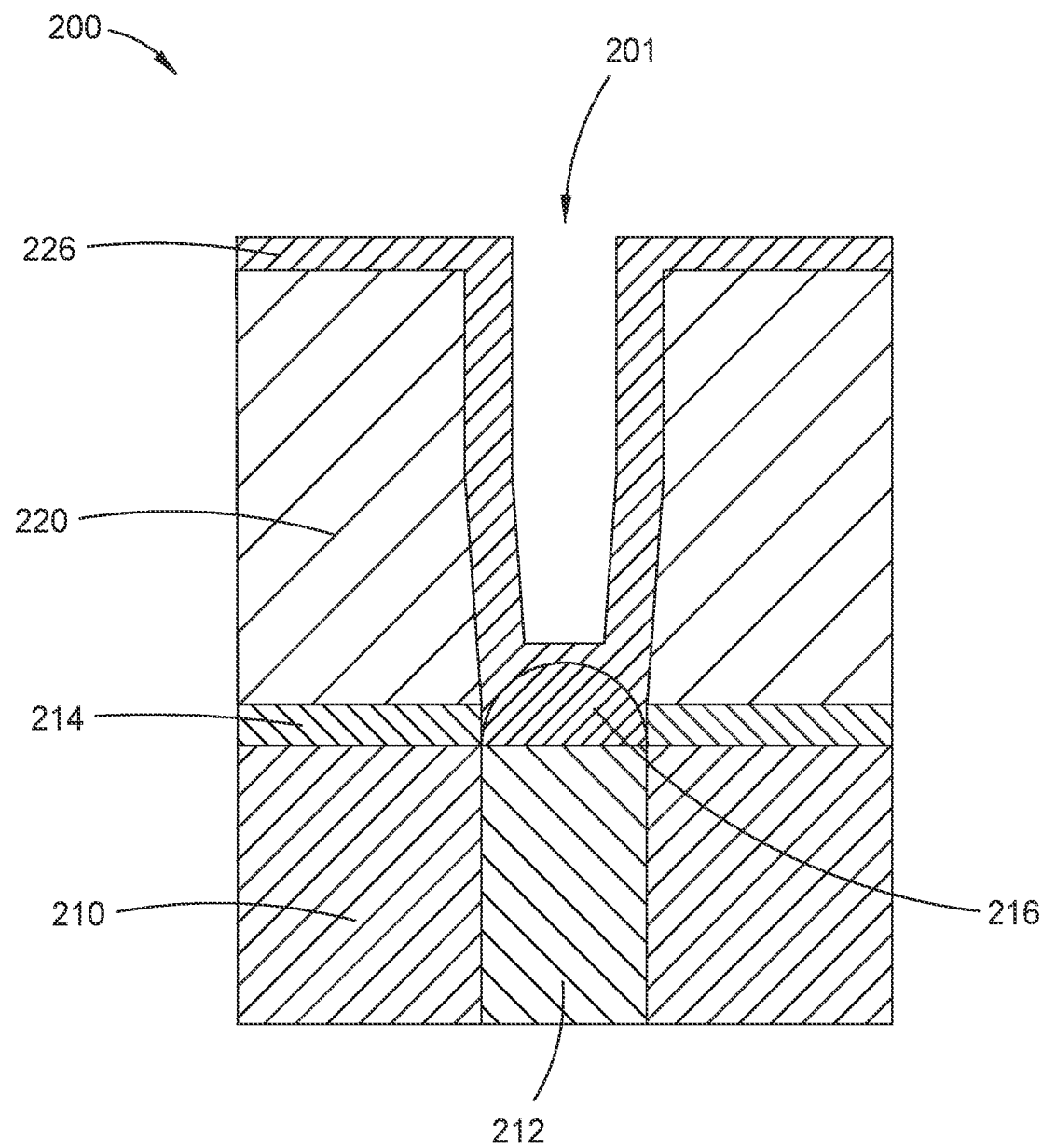

At operation 140, as shown in FIG. 2D, the tungsten carbide hard mask 222 is removed and a conformal layer 226 is deposited on the interconnect structure 200 such that the conformal layer 226 substantially lines the low-k dielectrics 220 and the selective tungsten layer 216. The conformal layer 226 protects the material underneath the conformal layer 226 from being damaged by additional operations of method 100 or additional operations after method 100. In addition, the conformal layer 226 prevents movement of atoms in the eventually deposited metal fill 228 (shown in FIG. 2E) from migrating into the rest of the interconnect structure 200.

The conformal layer 226 may act as a barrier layer, and be formed of tantalum nitride (TaN) or doped tantalum nitride (TaN), metal doped TaN, titanium nitride (TiN), tungsten nitride (WN), or tungsten nitride carbide (WCN). The barrier conformal layer 226 may be deposited using any suitable film deposition method, such as ALD.

Figure 2E:
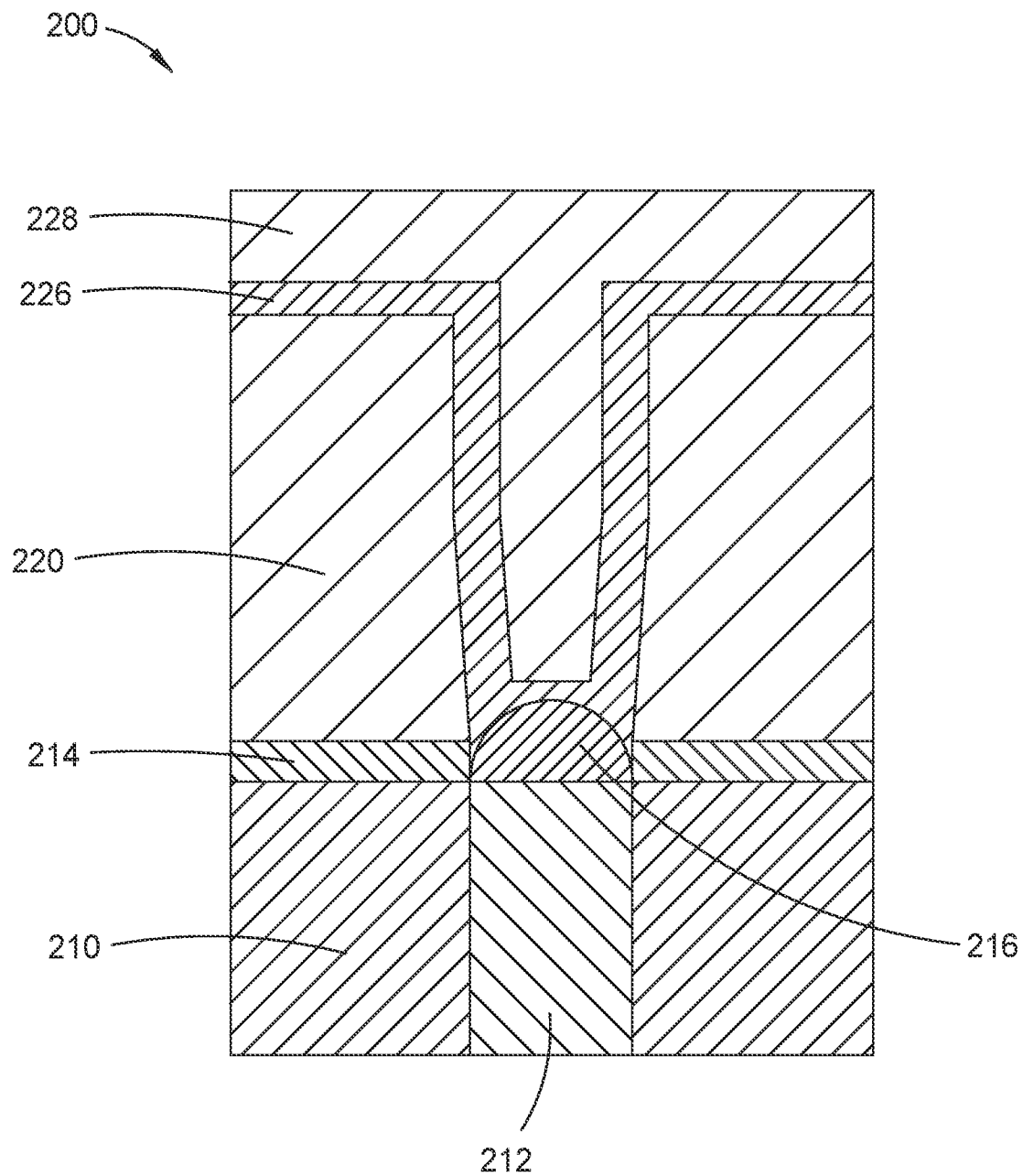

As shown in FIG. 2E, a metal fill process is performed to fill the remaining area between the low-k dielectrics 220 and cover the conformal layer 226 at operation 150. The metal fill process deposits a metal fill layer 228. In some embodiments, the metal fill 228 may include tungsten (W), copper (Cu), cobalt (Co), ruthenium (Ru), or molybdenum (Mo). In some embodiments, the metal fill layer 228 is tungsten (W).

Figure 3:
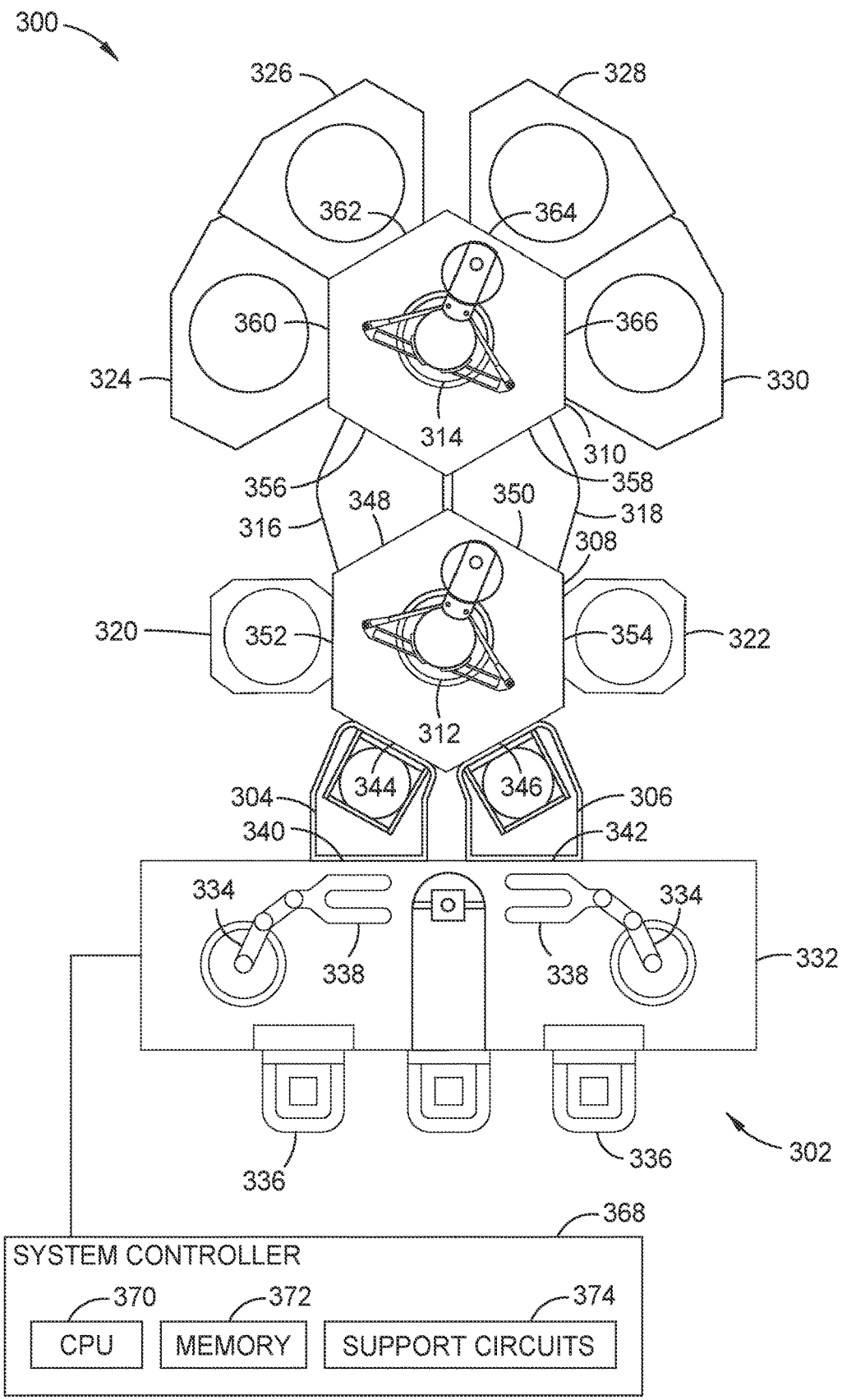
FIG. 3 illustrates a schematic representation of a processing tool for use with one or more embodiments of the disclosure.

Operation 150 may be performed via a chemical vapor deposition (CVD) process, and/or a physical vapor deposition (PVD), in a processing chamber, such as the processing chamber 324, 326, 328, or 330 shown in FIG. 3. In other embodiments, operation 150 is performed by use of an electroplating process.

FIG. 3 illustrates a schematic representation of a processing tool 300 for use with one or more embodiments of the disclosure. In some embodiments, the processing tool 300 may be utilized to perform all or a portion of the method 100.

The processing tool 300 generally includes a factory interface 302, load lock chambers 304, 306, transfer chambers 308, 310 with respective transfer robots 312, 314, holding chambers 316, 318, and processing chambers 320, 322, 324, 326, 328, 330. As detailed herein, substrates in the processing tool 300 can be processed in and transferred between the various chambers without exposing the substrates to an ambient environment exterior to the processing tool 300 (e.g., an atmospheric ambient environment such as may be present in a fab). For example, the substrates can be processed in and transferred between the various chambers maintained at a low pressure (e.g., less than or equal to about 300 Torr) or vacuum environment without breaking the low pressure or vacuum environment among various processes performed on the substrates in the processing tool 300. Accordingly, the processing tool 300 may provide for an integrated solution for some processing of substrates.

Examples of a processing system that may be suitably modified in accordance with the teachings provided herein include the Endura®, Producer® or Centura® integrated processing systems or other suitable processing systems commercially available from Applied Materials, Inc., located in Santa Clara, California. It is contemplated that other processing systems (including those from other manufacturers) may be adapted to benefit from aspects described herein.

In the illustrated example of FIG. 3, the factory interface 302 includes a docking station 332 and factory interface robots 334 to facilitate transfer of substrates. The docking station 332 is adapted to accept one or more front opening unified pods (FOUPs) 336. In some examples, each factory interface robot 334 generally includes a blade 338 disposed on one end of the respective factory interface robot 334 adapted to transfer the substrates from the factory interface 302 to the load lock chambers 304, 306.

The load lock chambers 304, 306 have respective ports 340, 342 coupled to the factory interface 302 and respective ports 344, 346 coupled to the transfer chamber 308. The transfer chamber 308 further has respective ports 348, 350 coupled to the holding chambers 316, 318 and respective ports 352, 354 coupled to processing chambers 320, 322. Similarly, the transfer chamber 310 has respective ports 356, 358 coupled to the holding chambers 316, 318 and respective ports 360, 362, 364, 366 coupled to processing chambers 324, 326, 328, 330. The ports 344, 346, 348, 350, 352, 354, 356, 358, 360, 362, 364, 366 can be, for example, slit valve openings with slit valves for passing substrates therethrough by the transfer robots 312, 314 and for providing a seal between respective chambers to prevent a gas from passing between the respective chambers. Generally, any port is open for transferring a substrate therethrough. Otherwise, the port is closed.

The load lock chambers 304, 306, transfer chambers 308, 310, holding chambers 316, 318, and processing chambers 320, 322, 324, 326, 328, 330 may be fluidly coupled to a gas and pressure control system (not specifically illustrated). The gas and pressure control system can include one or more gas pumps (e.g., turbo pumps, cryo-pumps, roughing pumps), gas sources, various valves, and conduits fluidly coupled to the various chambers. In operation, a factory interface robot 334 transfers a substrate from a FOUP 336 through a port 340 or 342 to a load lock chamber 304 or 306. The gas and pressure control system then pumps down the load lock chamber 304 or 306. The gas and pressure control system further maintains the transfer chambers 308, 310 and holding chambers 316, 318 with an interior low pressure or vacuum environment (which may include an inert gas). Hence, the pumping down of the load lock chamber 304 or 306 facilitates passing the substrate between, for example, the atmospheric environment of the factory interface 302 and the low pressure or vacuum environment of the transfer chamber 308.

With the substrate in the load lock chamber 304 or 306 that has been pumped down, the transfer robot 312 transfers the substrate from the load lock chamber 304 or 306 into the transfer chamber 308 through the port 344 or 346. The transfer robot 312 is then capable of transferring the substrate to and/or between any of the processing chambers 320, 322 through the respective ports 352, 354 for processing and the holding chambers 316, 318 through the respective ports 348, 350 for holding to await further transfer. Similarly, the transfer robot 314 is capable of accessing the substrate in the holding chamber 316 or 318 through the port 356 or 358 and is capable of transferring the substrate to and/or between any of the processing chambers 324, 326, 328, 330 through the respective ports 360, 362, 364, 366 for processing and the holding chambers 316, 318 through the respective ports 356, 358 for holding to await further transfer. The transfer and holding of the substrate within and among the various chambers can be in the low pressure or vacuum environment provided by the gas and pressure control system.

The processing chambers 320, 322, 324, 326, 328, 330 can be any appropriate chamber for processing a substrate. In some examples, the processing chamber 320 can be capable of performing an etch process, the processing chamber 322 can be capable of performing a cleaning process, and the processing chambers 326, 328, 330 can be capable of performing respective epitaxial growth processes. The processing chamber 320 may be a Selectra™ Etch chamber available from Applied Materials of Santa Clara, Calif. The processing chamber 322 may be a SiCoNi™ Pre-clean chamber available from Applied Materials of Santa Clara, Calif. The processing chamber 326, 328, or 330 may be a Centura™ Epi chamber, Volta™ CVD/ALD chamber, or Encore™ PVD chambers available from Applied Materials of Santa Clara, Calif.

A system controller 368 is coupled to the processing tool 300 for controlling the processing tool 300 or components thereof. For example, the system controller 368 may control the operation of the processing tool 300 using a direct control of the chambers 304, 306, 308, 310, 316, 318, 320, 322, 324, 326, 328, 330 of the processing tool 300 or by controlling controllers associated with the chambers 304, 306, 308, 310, 316, 318, 320, 322, 324, 326, 328, 330. In operation, the system controller 368 enables data collection and feedback from the respective chambers to coordinate performance of the processing tool 300.

The system controller 368 generally includes a central processing unit (CPU) 370, memory 372, and support circuits 374. The CPU 370 may be one of any form of a general-purpose processor that can be used in an industrial setting. The memory 372, or non-transitory computer-readable medium, is accessible by the CPU 370 and may be one or more of memory such as random access memory (RAM), read only memory (ROM), floppy disk, hard disk, or any other form of digital storage, local or remote. The support circuits 374 are coupled to the CPU 370 and may comprise cache, clock circuits, input/output subsystems, power supplies, and the like. The various methods disclosed herein may generally be implemented under the control of the CPU 370 by the CPU 370 executing computer instruction code stored in the memory 372 (or in memory of a particular processing chamber) as, for example, a software routine. When the computer instruction code is executed by the CPU 370, the CPU 370 controls the chambers to perform processes in accordance with the various methods.

Other processing systems can be in other configurations. For example, more or fewer processing chambers may be coupled to a transfer apparatus. In the illustrated example, the transfer apparatus includes the transfer chambers 308, 310 and the holding chambers 316, 318. In other examples, more or fewer transfer chambers (e.g., one transfer chamber) and/or more or fewer holding chambers (e.g., no holding chambers) may be implemented as a transfer apparatus in a processing system.

The embodiments described herein provide methods for removing chlorine (Cl) and tungsten (W) residue on low-k dielectrics after deposition of selective tungsten. In the method described herein, a organosilane precursor soak, such as 1-methyl-3,6-bis(trimethylsilyl)-1,4-cyclohexane ($C_{13}H_{26}Si_2$) (CHD) soak, is used to perform a reducing reaction to remove the residue formed within a feature formed in a substrate. In one example, a CHD soak removes the residue faster than other residue removal methods, does not damage any of the exposed layers within the formed feature (e.g., low-k dielectric containing layers), and is capable of being performed in the same processing chamber as the selective tungsten deposition.

While the foregoing is directed to embodiments of the present disclosure, other and further embodiments of the disclosure may be devised without departing from the basic scope thereof, and the scope thereof is determined by the claims that follow.

The invention claimed is:

1. A method of manufacturing an interconnect structure, comprising:
depositing a selective tungsten layer on a tungsten containing surface disposed within a feature, wherein the feature includes one or more surfaces that comprise a low-k dielectric material, and the depositing of the selective tungsten layer results in a residue forming on the low-k dielectric material;
performing soak process to reduce the residue via exposing the residue and the low-k dielectric material to an organosilane containing precursor soak, wherein the organosilane containing precursor comprises 1-methyl-3,6-bis(trimethylsilyl)-1,4-cyclohexane ($C_{13}H_{26}Si_2$) (CHD); and
forming a conformal layer over the low-k dielectric material and the selective tungsten layer.

2. The method of claim 1, wherein the residue comprises at least one of tungsten and chlorine.

3. The method of claim 1, wherein the conformal layer comprises tantalum nitride (TaN).

4. The method of claim 1, wherein the soak process and the depositing the selective tungsten layer are performed in a same processing chamber.

5. The method of claim 1, wherein the depositing the selective tungsten layer is performed via a fluorine-free tungsten (FFW) deposition process.

6. The method of claim 5, wherein the FFW deposition process comprises:
exposing the interconnect structure to a fluorine-free tungsten precursor; and
exposing the interconnect structure to a fluorine-free tungsten reagent.

7. A method of manufacturing an interconnect structure, comprising:
performing a pretreatment process;
depositing a selective tungsten layer on a tungsten containing surface disposed within a feature, wherein the feature includes one or more surfaces that comprise a low-k dielectric material, and wherein the depositing results in residue forming on the low-k dielectric material;
performing a 1-methyl-3,6-bis(trimethylsilyl)-1,4-cyclohexane (CHD) soak, wherein the CHD soak reduces the residue;
forming a conformal layer over the low-k dielectric material and the selective tungsten layer; and
depositing a metal fill layer over the conformal layer.

8. The method of claim 7, wherein the pretreatment process comprises at least one of:
a cleaning process to remove impurities;
a defect curing process; and
an oxide reduction process.

9. The method of claim 7, wherein the conformal layer comprises tantalum nitride (TaN).

10. The method of claim 7, wherein the CHD soak and the depositing the selective tungsten layer are performed in a same processing chamber.

11. The method of claim 7, wherein the depositing the selective tungsten layer is performed via a fluorine-free tungsten (FFW) deposition process.

12. The method of claim 11, wherein the FFW deposition process comprises:
exposing the interconnect structure to a fluorine-free tungsten precursor; and
exposing the interconnect structure to a fluorine-free tungsten reagent.

13. The method of claim 12, wherein the fluorine-free tungsten precursor comprises a first chemical and the fluorine-free tungsten reagent comprises a second chemical, wherein the first chemical and the second chemical are the same.

14. A method of manufacturing an interconnect structure, comprising:
performing a pretreatment process;
depositing a selective tungsten layer on a tungsten containing surface using a fluorine-free tungsten (FFW) deposition process, wherein the tungsten containing surface is disposed within a feature, wherein the feature includes one or more surfaces that comprise a low-k dielectric material, and wherein the depositing results in a chlorine and tungsten residue forming on the low-k dielectric material;
performing a 1-methyl-3,6-bis(trimethylsilyl)-1,4-cyclohexane (CHD) soak, wherein the CHD soak reduces the chlorine and tungsten residue;
forming a conformal layer over the low-k dielectric material and the selective tungsten layer; and
depositing a metal fill layer over the conformal layer.

15. The method of claim 14, wherein the metal fill layer comprises tungsten.

16. The method of claim 14, wherein the conformal layer comprises tantalum nitride (TaN).

17. The method of claim 14, wherein the pretreatment process includes one or more of etching, reducing, oxidizing, hydroxylating, annealing, and/or thermally treating the interconnect structure.

18. The method of claim 14, wherein the low-k dielectric material comprises one or more of organosilicate glass (SiCOH), silicon dioxide ($SiO_2$), silicon nitride ($SisN_4$), silicon carbide (SiC), aluminum oxide ($Al_2O_3$), and aluminum nitride (AlN).

* * * * *